United States Patent
Shin et al.

(10) Patent No.: US 8,304,768 B2
(45) Date of Patent: Nov. 6, 2012

(54) THIN FILM TRANSISTOR ARRAY SUBSTRATE AND METHOD FOR MANUFACTURING THE SAME

(75) Inventors: Ki Taeg Shin, Gumi-si (KR); Sung Hyun Cho, Seoul (KR); Tae Joon Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 891 days.

(21) Appl. No.: 12/179,072

(22) Filed: Jul. 24, 2008

(65) Prior Publication Data
US 2009/0026451 A1  Jan. 29, 2009

(30) Foreign Application Priority Data
Jul. 25, 2007 (KR) .................. 10-2007-0074723

(51) Int. Cl.
*H01L 29/10* (2006.01)
*H01L 31/00* (2006.01)
(52) U.S. Cl. ................. 257/59; 257/E27.111
(58) Field of Classification Search .......... 257/59, 257/E27.111, E21.535, E29.151, E51.005; 438/129, 149
See application file for complete search history.

(56) References Cited

U.S. PATENT DOCUMENTS

| 6,900,872 B2 * | 5/2005 | Kang ............... 349/141 |
| 2003/0053005 A1 * | 3/2003 | Song et al. ........ 349/43 |
| 2005/0057231 A1 * | 3/2005 | Morita ............. 323/268 |

* cited by examiner

Primary Examiner — Lex Malsawma
(74) Attorney, Agent, or Firm — Birch, Stewart, Kolasch & Birch, LLP

(57) ABSTRACT

A thin film transistor array substrate includes according to an embodiment a plurality of gate lines and a plurality of data lines on a substrate, to define pixel regions crossing each other; thin film transistors each formed at the intersection of the gate lines and the data lines, and including a gate electrode, a source electrode and a drain electrode; common lines, each including a first pattern formed across the data lines, a second pattern formed adjacent to the data lines on both sides in the pixel region and parallel to the data lines, and a third pattern formed adjacent to the gate lines to connect the second pattern disposed on both the sides in the associated one of the pixel regions, and passing below the drain electrode of the thin film transistors; and pixel electrodes formed in the pixel regions.

8 Claims, 9 Drawing Sheets

THIN FILM TRANSISTOR ARRAY SUBSTRATE AND METHOD FOR MANUFACTURING THE SAME

This application claims the benefit of Korean Patent Application No. 10-2007-074723, filed on Jul. 25, 2007, which is hereby incorporated by reference as if fully set forth herein.

BACKGROUND OF THE INVENTION

1. Field of the Invention

The present invention relates to a liquid crystal display device, and more particularly, to a thin film transistor array substrate and a method for manufacturing the same, which has a "U"-shaped common line formed in a pixel region in order to improve an aperture ratio, and can decrease a resistance by increasing a line width of the common line from a region near a thin film transistor to a region below a drain electrode and can prevent defects such as line cut, etc.

2. Discussion of the Related Art

With the progress of an information-dependent society, the demand for various display devices has increased. To meet such a demand, efforts have recently been made to research flat panel display devices such as liquid crystal display (LCD) devices, plasma display panels (PDPs), electro luminescent display (ELD) devices, vacuum fluorescent display (VFD) devices, and the like. Some types of such flat panel display devices are being practically applied to various appliances for display purposes.

In particular, LCDs have been used as a substitute for cathode ray tubes (CRTs) in association with mobile image display devices because LCDs have advantages of superior picture quality, low weight, thinness, and low power consumption. Thus, LCDs are currently most widely used. Various applications of LCDs are being developed in association with not only mobile image display devices such as monitors of laptop computers, but also monitors of TVs to receive and display broadcasting signals, and monitors of computers.

Successful application of such LCDs to diverse image display devices depends on whether or not the LCDs can realize desired high picture quality including high resolution, high brightness, large display area, and the like, while maintaining desired characteristics of low weight, thinness, and low power consumption.

Hereinafter, a conventional thin film transistor array substrate will be described with reference to the annexed drawings.

FIG. 1 is a plan view illustrating one pixel of a conventional thin film transistor array substrate, and FIG. 2 is a sectional view taken along line I-I' of FIG. 1.

A conventional thin film transistor array substrate includes a first substrate 10 and a second substrate (not shown) which are attached to each other with a predetermined space therebetween, and a liquid crystal layer (not shown) interposed between the first substrate 10 and the second substrate.

Describing in more detail, as shown in FIGS. 1 and 2, the conventional thin film transistor array substrate includes crossing gate lines 11 and data lines 12 on the first substrate 10. The crossing gate lines 11 and data lines 12 define pixel regions. A thin film transistor (TFT) is formed at each intersection of the gate lines 11 and the data lines 12. A pixel electrode 13 is formed in each pixel region.

The thin film transistor (TFT) includes a gate electrode 11a that is formed to be protruded from the gate line 11, a source electrode 12a that is formed to be protruded from the data line 12 and overlaps the gate electrode 11a, and a drain electrode 12b that is spaced apart from the source electrode 12a on the gate electrode 11a. An island-shaped semiconductor layer 14 is formed to cover the gate electrode 11a while being in contact with lower surfaces of the source electrode 12a and the drain electrode 12b. The semiconductor layer 14 has a laminated structure including a lower amorphous silicon layer 14a and an upper impurity layer ($n^+$ layer) 14b disposed on the amorphous silicon layer 14a.

A gate insulating film 15 is interposed between the semiconductor layer 14 and the layer including the gate line 11, the gate electrode 11a and a common line 21. A protective film 16 is interposed between the pixel electrode 13 and the layer including the data line 12 and the source/drain electrodes 12a and 12b. Therefore, insulation between the electrodes can be kept.

The common line 21 is formed across the pixel region and parallel to the gate line 11. A storage capacitor is defined at a region in which the common line 21 and the pixel electrode 13 overlap each other. The storage capacitor includes electrodes defined by the common line 21 and the pixel electrode 13, and dielectric layers defined by the gate insulating film 15 and the protective film 16 that are interposed between the common line 21 and the pixel electrode 13.

However, in such a case, because the storage capacitor is defined at the region in which the common line 21 and the pixel electrode 13 overlap each other, loss of an aperture ratio is generated by as much as the overlap area of the common line 21 and the pixel electrode 13 by the arrangement of the common line 21 which is generally made of light shielding metal.

Although not illustrated, the second substrate includes a black matrix layer (not shown) for blocking incidence of light to a region other than the pixel regions. The second substrate also includes R, G and B color filter layers (not shown) formed at a region corresponding to each pixel region and adapted to reproduce color tones, and a common electrode (not shown) formed on the color filter layers and adapted to reproduce an image.

The conventional thin film transistor array substrate as constituted above has the following problems.

When the common line composing the storage capacitor is formed to overlap the pixel electrode, loss of an aperture ratio is generated by as much as the overlap area of the common line and the pixel electrode.

If a line width of the common line is reduced or a shape of the common line is changed in order to prevent the loss of an aperture ratio, the line may be cut, or resistance of the common line may become large, which causes shutdown crosstalk. Thus, it is also required to improve such a problem.

SUMMARY OF THE INVENTION

Accordingly, the present invention is directed to a thin film transistor array substrate and a method for manufacturing the same that substantially obviate one or more problems due to limitations and disadvantages of the related art.

An object of the present invention is to provide a thin film transistor array substrate which has a "U"-shaped common line formed in a pixel region in order to improve an aperture ratio, and can decrease a resistance by increasing a line width of the common line from a region near a thin film transistor to a region below a drain electrode and can prevent defects such as line cut, etc.

Another object of the present invention is to provide a method for manufacturing the above thin film transistor array substrate and to provide a liquid crystal display device including the thin film transistor array substrate.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve the objects and other advantages and in accordance with the purpose of the invention, as embodied and broadly described herein, a thin film transistor array substrate comprises: a plurality of gate lines and a plurality of data lines on a substrate, to define pixel regions crossing each other; thin film transistors, each formed at the intersection of the gate lines and the data lines, and including a gate electrode, a source electrode and a drain electrode; common lines, each including a first pattern formed across the data lines, a second pattern formed adjacent to the data lines on both sides in the pixel region and parallel to the data lines, and a third pattern formed adjacent to the gate lines to connect the second pattern disposed on both the sides in the associated one of the pixel regions, and passing below the drain electrode of the thin film transistors; and pixel electrodes formed in the pixel regions.

Also, to achieve the objects and other advantages and in accordance with the purpose of the invention, as embodied and broadly described herein, a method for manufacturing a thin film transistor array substrate, comprising: preparing a substrate, on which a plurality of pixel regions spaced apart from each other are defined; forming a plurality of gate lines arranged in one direction dividing the pixel regions, gate electrodes protruded toward the pixel regions from the gate lines, and common lines on the substrate, each of the common lines including a first pattern connecting the adjacent pixel regions, a second pattern disposed adjacent to both sides in the pixel region and parallel to the data lines, and a third pattern adjacent to the gate lines to connect the second pattern on both the sides and to have a width larger than the second pattern; forming a plurality of data lines crossing the plurality of gate lines to define the pixel regions, source electrodes protruded from the data lines to regions above the gate electrodes, and drain electrodes spaced apart from the source electrodes, each of the drain electrodes overlapped with the third pattern, wherein the third pattern is passing below the drain electrode; and forming pixel electrodes in the pixel regions.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention associated with a thin film transistor array substrate and a method for manufacturing the same, examples of which are illustrated in the accompanying drawings. Wherever possible, the same reference numbers will be used throughout the drawings to refer to the same or like parts.

Figure 1:
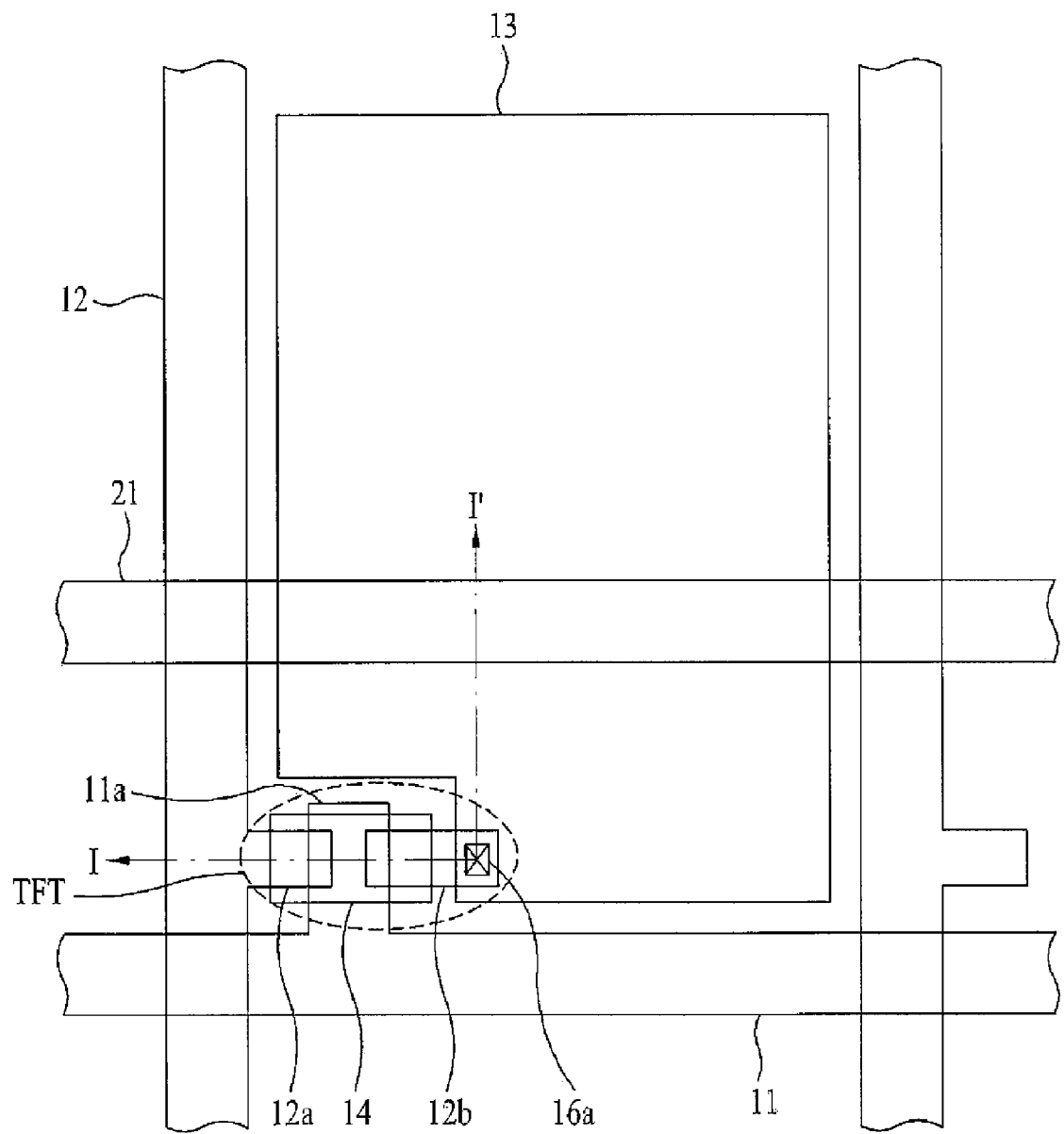
FIG. 1 is a plan view illustrating one pixel of a conventional thin film transistor array substrate.
Figure 2:
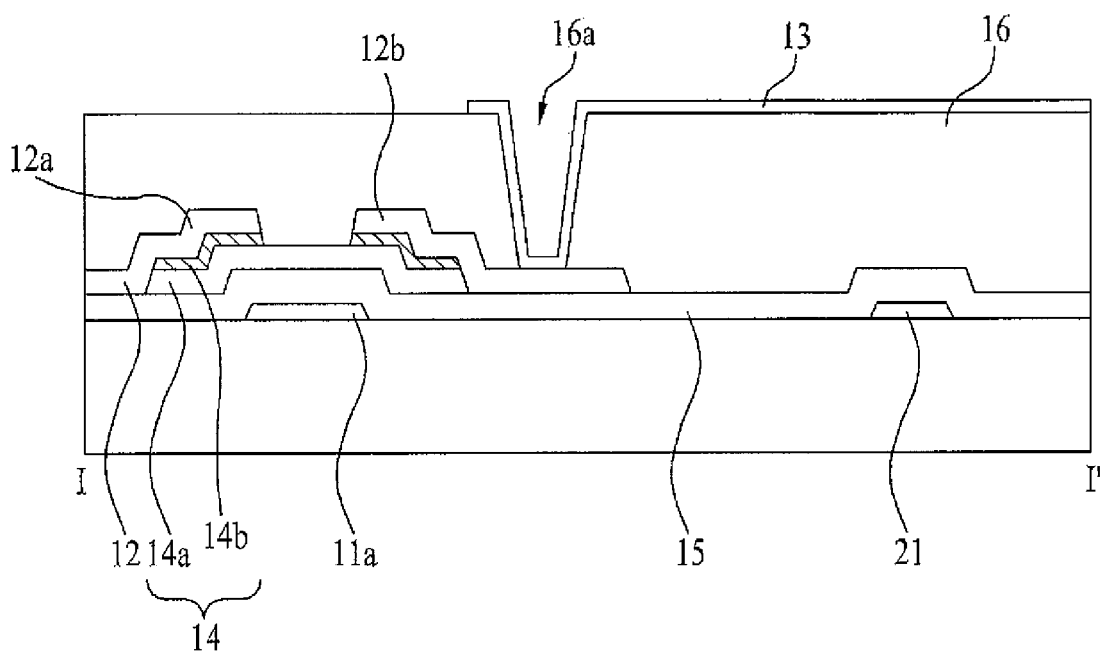
FIG. 2 is a sectional view taken along line I-I' of FIG. 1.
Figure 3:
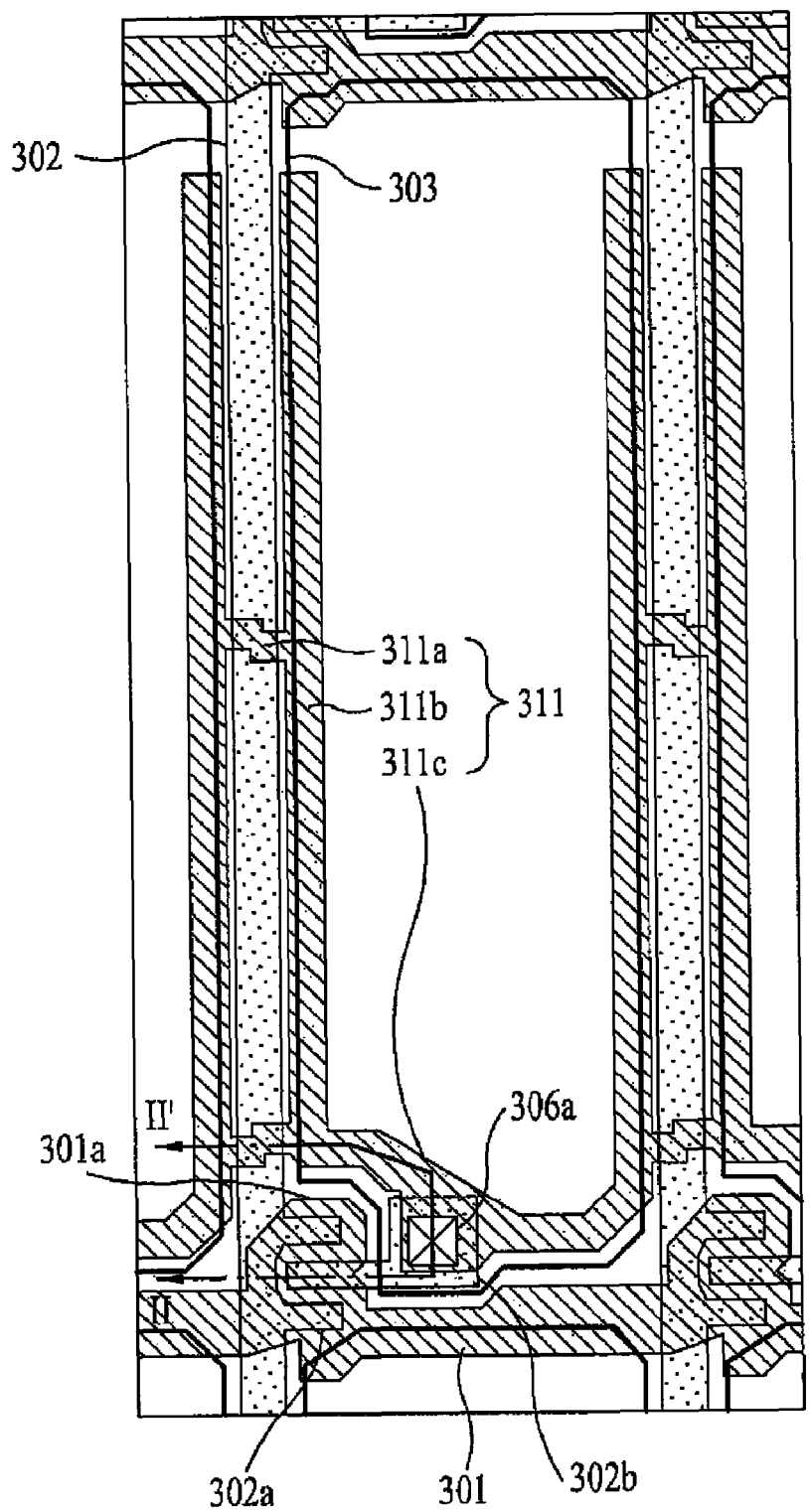
FIG. 3 is a plan view illustrating a thin film transistor array substrate according to an exemplary embodiment of the present invention.
Figure 4:
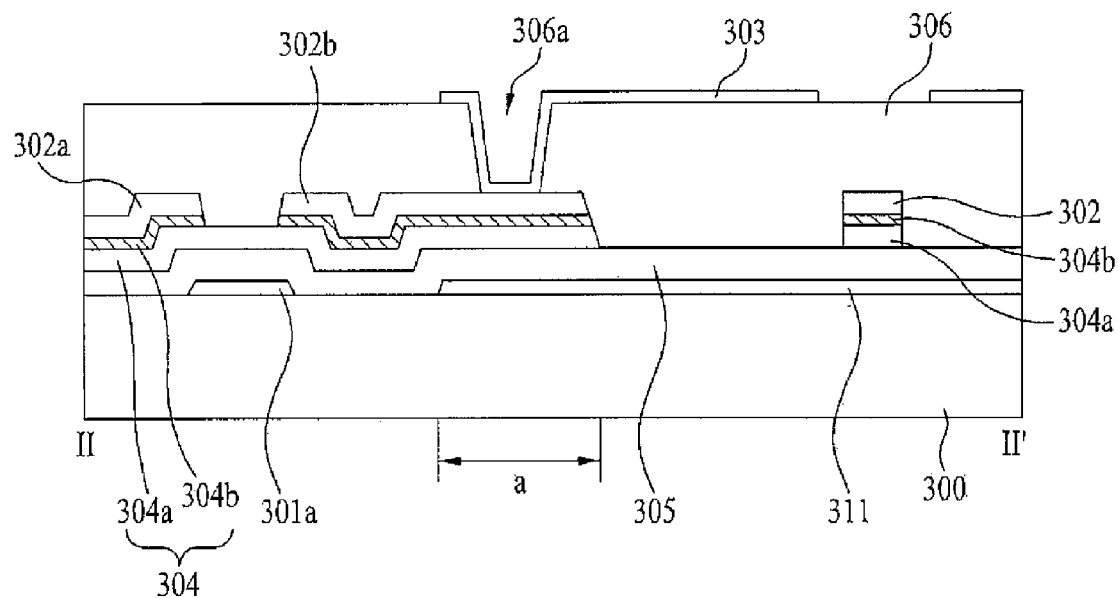
FIG. 4 is a sectional view taken along line II-II' of FIG. 3.

FIG. 3 is a plan view illustrating a thin film transistor array substrate according to an exemplary embodiment of the present invention, and FIG. 4 is a sectional view taken along line II-II' of FIG. 3.

As shown in FIGS. 3 and 4, a thin film transistor array substrate according to the present invention includes a plurality of gate lines 301 and a plurality of data lines 302 intersecting each other to define pixel regions on the substrate 300, thin film transistors (TFTs) formed at the intersections of the gate lines 301 and the data lines 302, and pixel electrodes 303 formed in the pixel regions. The pixel regions are spaced apart from each other with a predetermined gap therebetween, and are defined as a matrix shape. The gate lines 301 and the data lines 302 pass between the respective pixel regions.

Each of the thin film transistors (TFTs) includes a gate electrode 301a protruded from one of the gate lines 301, a source electrode 302a protruded from one of the data lines 302 so as to overlap the gate electrode 301a in a "C"-shape, and a drain electrode 302b introduced into the "C"-shaped source electrode 302a while being spaced apart from the source electrode 302a on the gate electrode 301a. An island-shaped semiconductor layer 304 is formed to cover the gate electrode 301a while being in contact with lower surfaces of the source electrode 302a and the drain electrode 302b. The semiconductor layer 304 has a laminated structure including a lower amorphous silicon layer 304a and an upper impurity layer (n$^+$ layer) 304b disposed on the amorphous silicon layer 304a. The reason for forming the source electrode 302a in a "C"-shape is to provide a "C"-shaped channel between the source electrode 302a and the drain electrode 302b, to thereby secure a wider channel region. The shape of such a channel may be changed in various shapes, e.g., an "L"-shape, a "-"-shape, etc.

The substrate further includes common lines 311, each including a first pattern 311a formed across the data lines 302, a second pattern 311b formed adjacent to the data lines 302 on both sides in the pixel region and extended in the data line direction, and a third pattern 311c formed adjacent to the gate line 301 to connect the second pattern 311b disposed on both the sides in the pixel region, and passing below the drain electrode 302b of the thin film transistor (TFT). The shape defined by the second pattern 311b and the third pattern 311c near the periphery of the pixel region is a substantially "U"- shape, and the first pattern 311a is adapted to connect the adjacent "U"-shaped patterns which are respectively provided in the pixel regions.

Here, since the third pattern 311c overlaps the drain electrode 302b, the third pattern 311c has a line width larger than the first and second patterns 311a and 311b. Referring to FIG. 3, the third pattern 311c has a plan shape such that the third pattern 311c is slanted at an angle of 0 to 30° so as to pass by the drain electrode 302b from a region above the gate electrode 301a while being spaced apart from the gate electrode 301a with a predetermined gap, and has a protruding portion protruded from the slanted portion in order to he overlapped with the drain electrode 302b. A contact hole 306a is formed, through which the drain electrode 302h is overlapped with the pixel electrode 303 to be electrically connected therewith. The third pattern 311c is also formed at a region below the contact hole 306a.

In the protruding portion of the third pattern 311c, which is overlapped with the drain electrode 302b, the line width of the third pattern 311c is set to be larger than the line width of the drain electrode 302b, more particularly, is in the range of about 10 to 28 μm. At this time, the line width of the second pattern 311b is set to be 4 to 8 μm. In other words, the protruding portion of the third pattern 311c has the line width larger than the second pattern 311b.

Since the second pattern 31b is positioned on both the sides in the pixel region, light leakage due to alignment distortion of liquid crystal occurring at an edge portion of the pixel electrode 303 is prevented.

It is preferred that the gate line 301, the gate electrode 301a and the common line 311 including the first to third patterns 311a, 311b and 311c are formed on the same layer.

The first pattern 311a formed across the data lines 302 may be provided in plural numbers (one or more) between the adjacent pixel regions. It is illustrated in FIG. 3 that two first patterns 311a are formed between the two adjacent pixel regions. The first pattern 311a is formed on the same layer as the gate line 301, in consideration of capacitance generated at the overlap area of the first pattern 311a and the data line 302 and a resistance value that the common line 311 can have in the substrate.

The pixel electrode 302 is partially overlapped with the second pattern 311b of the common line 311, and is fully overlapped with the third pattern 311c of the common line 311. A storage capacitor is defined at the overlap area of the pixel electrode 302 and the common line 311.

In such a case, since the third pattern 311c of the common line 311 is overlapped with the drain electrode 302b, a transparent portion occupied by the light shielding common line 311 within the pixel region is reduced, and accordingly loss of an aperture ratio can be minimized. Further, since the third pattern 311c has the slanted portion extended from the edge portion of the second pattern 311b and the protruding portion extended toward a region below the drain electrode 302b, the common line 311 is prevented from having stepped portions adjacent to the thin film transistor (specifically, drain electrode) for the purpose of being spaced apart from the drain electrode on the plane (which will be described later), and as a result a problem of occurrence of line cut at the stepped portions can be solved.

Although not illustrated, a color filter array including a black matrix layer and color filter layers is formed on a second substrate facing the thin film transistor array substrate according to the present invention. Also, a common electrode is formed over the entire surface of the second substrate. A liquid crystal is aligned between the thin film transistor array substrate and the second substrate by a vertical electric field between the pixel electrode 303 and the common electrode, thereby achieving image display.

FIGS. 5A to 5E are sectional views illustrating processing steps of a method for manufacturing the thin film transistor array substrate according to an exemplary embodiment of the present invention.

In accordance with the manufacturing method, a substrate, on which a plurality of pixel regions spaced apart from each other are defined, is first prepared.

Figure 5A:
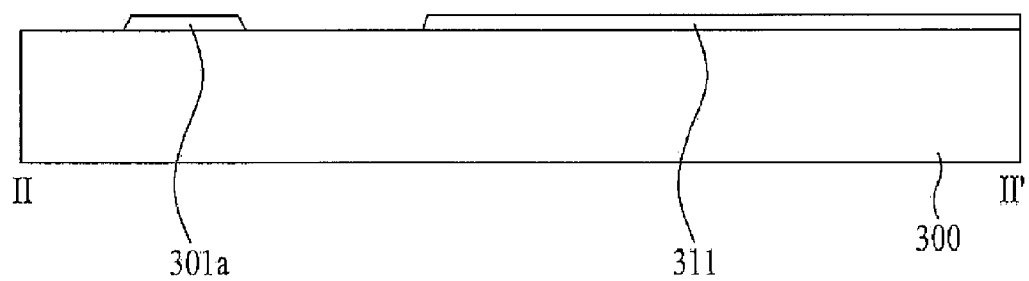
FIGS. 5A to 5E are sectional views illustrating processing steps of a method for manufacturing the thin film transistor array substrate according to an exemplary embodiment of the present invention.

As shown in FIG. 5A, metal is deposited on the substrate 300. Thereafter, the metal deposited on the substrate 300 is selectively removed, in order to form a plurality of gate lines 301 arranged in one direction dividing the pixel regions, a gate electrode 301a protruded toward the pixel region from one of the gate lines 301, and a common line 311 including a first pattern 311a connecting the adjacent pixel regions, a second pattern 311b disposed on both sides in the pixel region and extended in a direction of crossing the gate line 301, and a third pattern 311c disposed adjacent to the gate line 301 in the pixel region to connect the second pattern 311b and having a width larger than the second pattern 311b. The gate line 301 and the common line 311 are formed on the same layer while being spaced apart from each other. Also, the gate electrode 311a and the common line 311 are formed on the same layer, and are spaced apart from each other to prevent electric short.

Figure 5B:
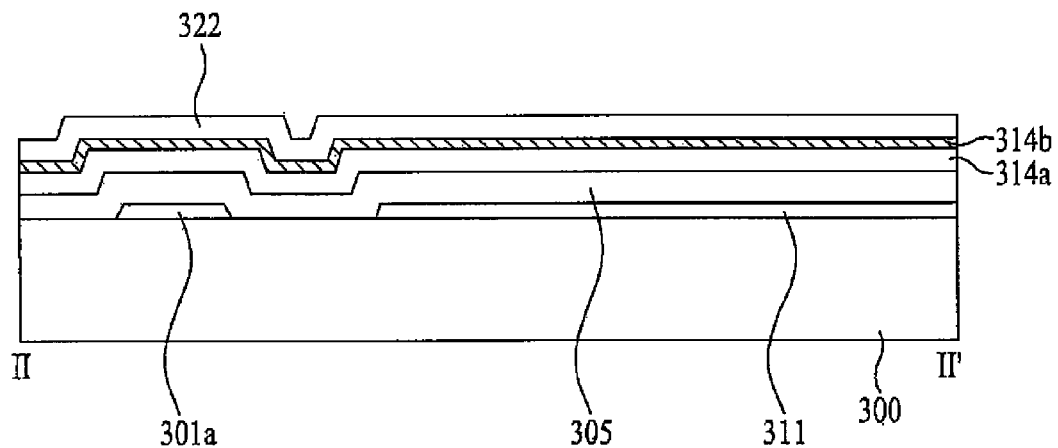

As shown in FIG. 5B, a gate insulating film 311, an amorphous silicon layer 314a, an impurity layer 314b and a metal layer 322 are sequentially formed over the entire upper surface of the substrate 300 including the gate line 301, the gate electrode 301a and the common line 311.

Figure 5C:
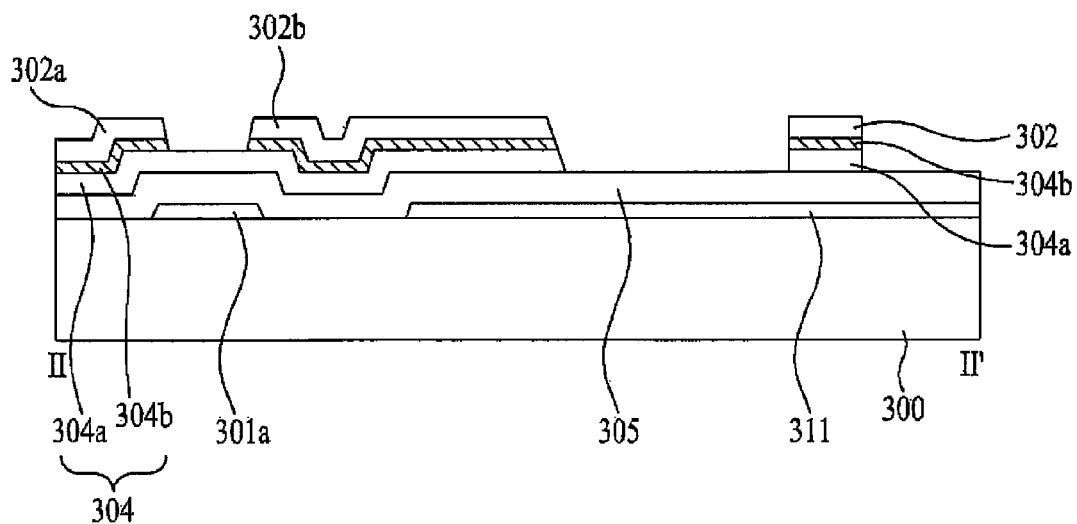

As shown in FIG. 5C, a photosensitive film (not shown) is coated on the metal layer 322, and a mask (not shown) is provided on the photosensitive film. On the mask, a thin film transistor forming portion and a light shielding portion corresponding to a region intersecting the plurality of gate lines 301 to divide the pixel regions are defined. Also, a semipermeable portion is defined by a region corresponding to a channel portion of the thin film transistor forming portion, and a permeable portion is defined by a region corresponding to the remaining portion. The photosensitive film has a positive photosensitivity. If the photosensitive film has a negative photosensitivity, the mask is formed to have a type opposite to the aforementioned type.

Thereafter, the photosensitive film is exposed to light and developed by use of the mask (not shown), in order to form a first photosensitive film pattern (not shown) in such a manner that the region corresponding to the permeable portion is totally removed (i.e., the area of a full thickness of the region is removed), the region corresponding to the light shielding portion is remained as it is, and the region corresponding to the semipermeable portion is partially remained. Subsequently, the metal layer 322, the impurity layer 314b and the amorphous silicon layer 314a are selectively removed by use of the first photosensitive film pattern. Thereby, a plurality of data lines 302 are formed at the region intersecting the plurality of gate lines 301 to divide the pixel regions, and a semiconductor layer pattern, which is protruded from the data line 302 to a region above the gate electrode 301 and is extended to overlap the protruding portion of the third pattern 311c, is formed at the thin film transistor forming portion.

Thereafter, the first photosensitive film pattern is subjected to ashing, so that the remaining area of the region corresponding to the semipermeable portion is removed, thereby forming a second photosensitive film pattern. The metal layer 322 and the impurity layer 314b of the semiconductor layer pattern are removed by use of the second photosensitive film pattern, in order to form a source electrode 302a protruded from the data line 302 so as to overlap the gate electrode 301a in a "C"-shape, and a drain electrode 302b spaced apart from the source electrode 302a with a "C"-shaped channel at the border between the drain electrode 302b and the source electrode 302a. At this time, the drain electrode 302b is overlapped with the protruding portion of the third pattern 311c.

A semiconductor layer 304 having a laminated structure including a lower amorphous silicon layer 304a and an upper impurity layer (n$^+$ layer) 304b is defined below the source electrode 302a and the drain electrode 302b. The impurity layer 304b between the source electrode 302a and the drain electrode 302b is removed to define a channel.

Figure 5D:
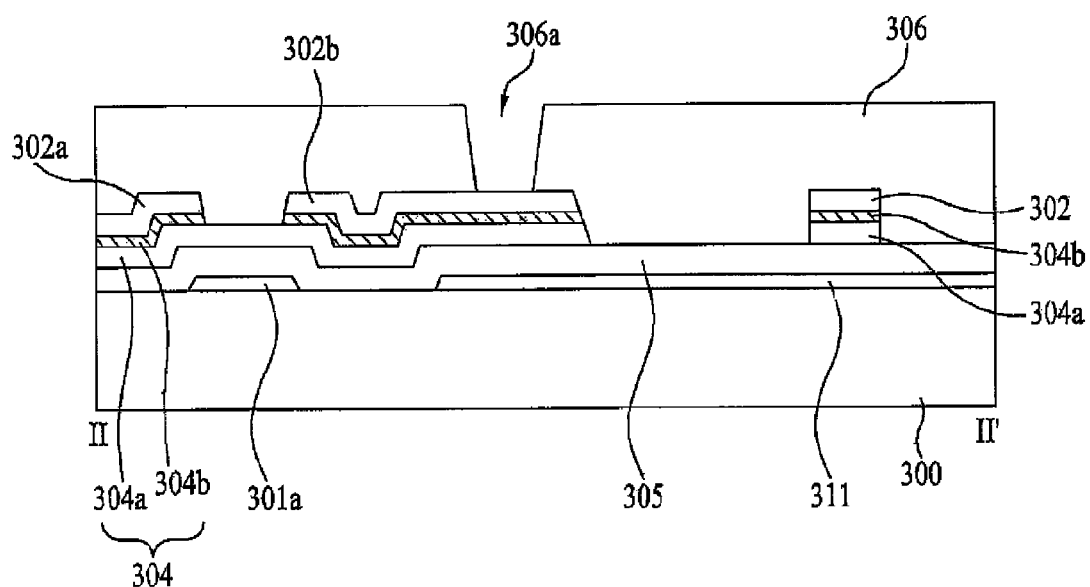

As shown in FIG. 5D, a protective film is deposited over the entire upper surface of the gate insulating film 305 including the semiconductor layer 304, the source/drain electrodes 302a and 302b and the data line 302. Thereafter, the protective film is selectively removed to form a protective film hole 306a, through which a portion of the upper surface of the drain electrode 302b is exposed.

Figure 5E:
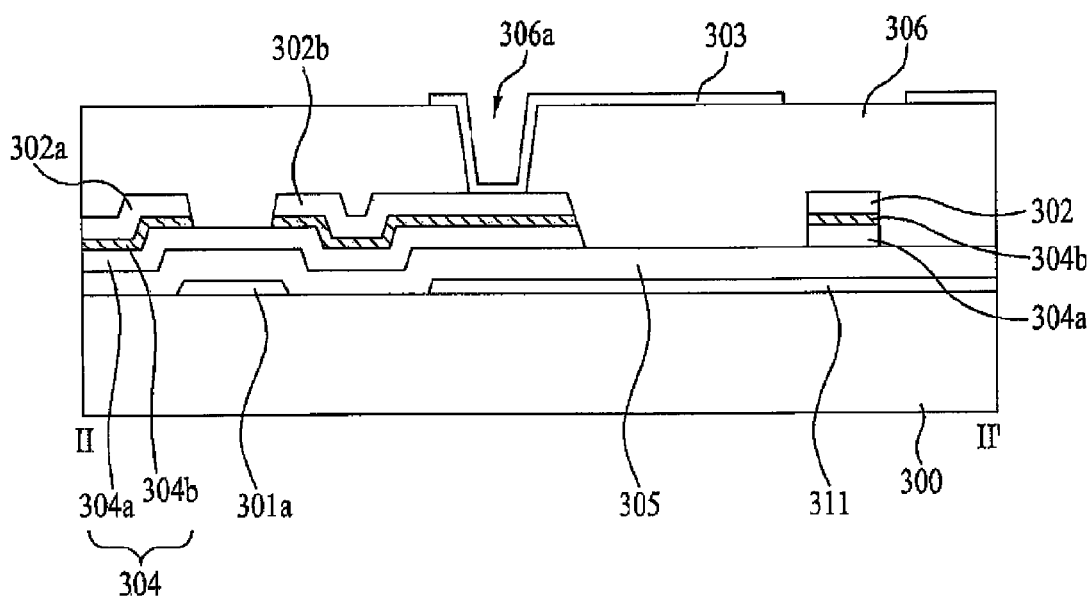

As shown in FIG. 5E, a transparent electrode is deposited over the entire upper surface of the protective film 306 including the protective film hole 306a. The transparent electrode is selectively removed to form a pixel electrode 303 corresponding to the pixel region.

The pixel electrode 303 is partially overlapped with the second pattern 311b of the common line 311, which is positioned on both the sides in the pixel region, by a predetermined width, and is fully overlapped with the third pattern 311c. A storage capacitor is defined at a region in which the common line 311 and the pixel electrode 303 overlap each other. The storage capacitor includes electrodes defined by metal components of the common line 311 and the pixel electrode 303, and dielectric layers defined by the gate insulating film 305 and the protective film 306 that are interposed between the common line 311 and the pixel electrode 303.

Hereinafter, a comparative example with the structure of one pixel of the thin film transistor array substrate according to the present invention will be described.

Figure 6:
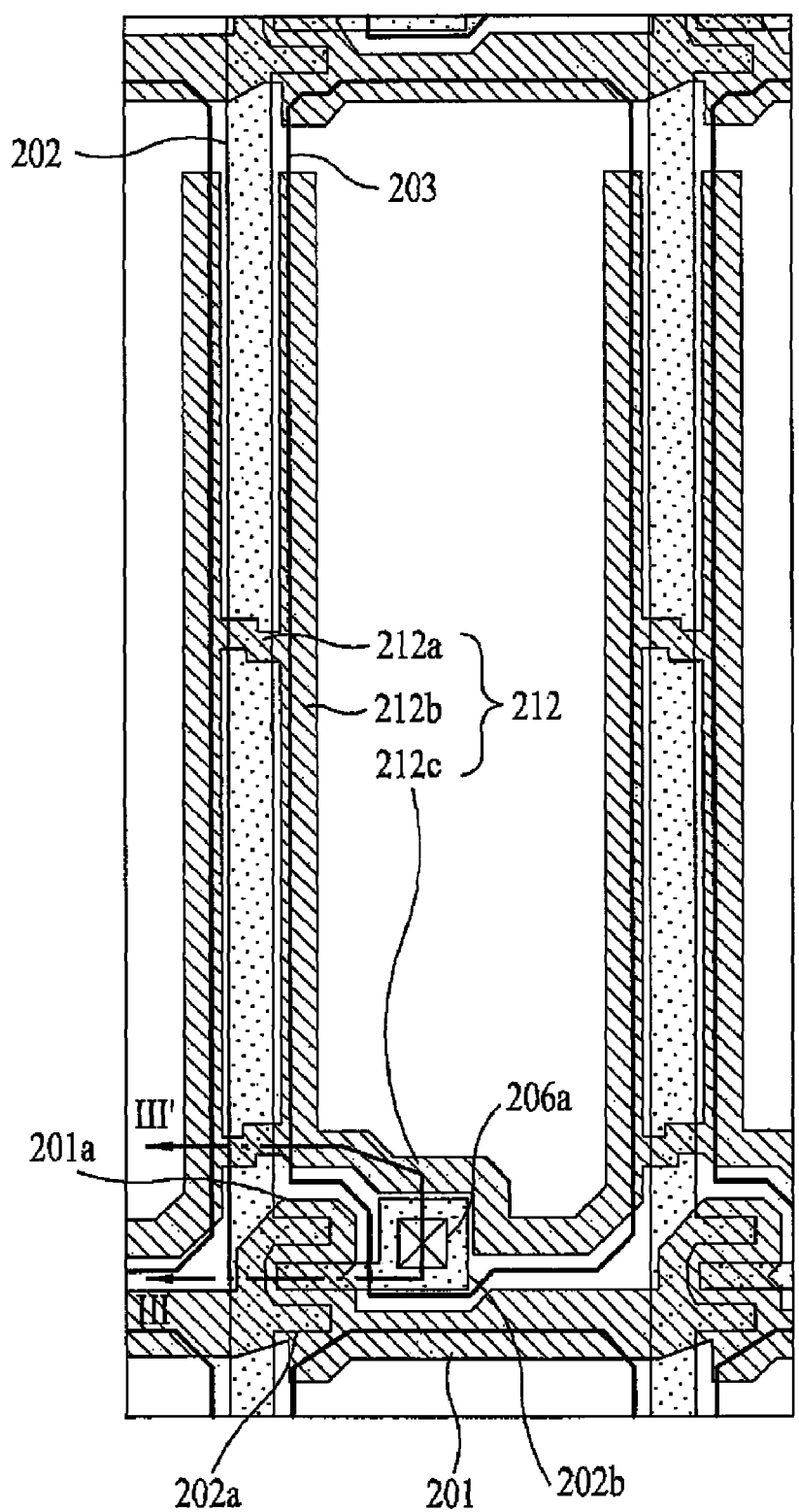
FIG. 6 is a plan view illustrating a liquid crystal display device having a "U"-shaped Vcom structure spaced apart from a drain electrode.
Figure 7:
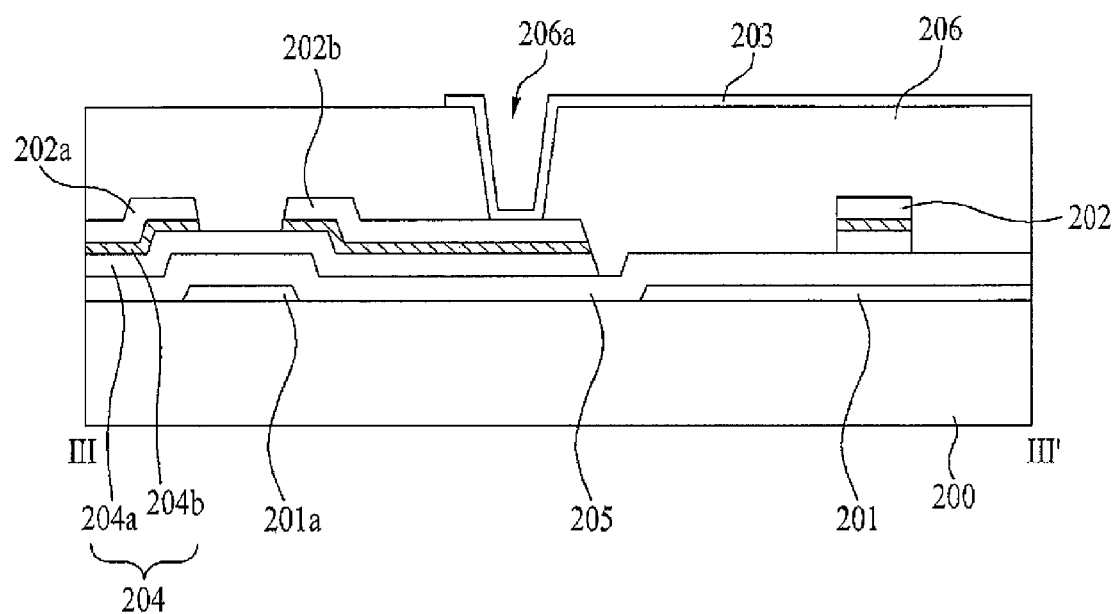
FIG. 7 is a sectional view taken along line III-III' of FIG. 6.

FIG. 6 is a plan view illustrating one pixel of a thin film transistor array substrate including a common line having a "U"-shaped Vcom structure spaced apart from a drain electrode, and FIG. 7 is a sectional view taken along line III-III' of FIG. 6.

As shown in FIGS. 6 and 7, in a case where the substrate includes a common line 212 spaced apart from a drain electrode 202b, the common line 212 includes a first pattern 212a formed across data lines 202 between pixel regions spaced apart from each other, a second pattern 212b formed on both sides in the pixel region, and a third pattern 212c formed apart from the gate electrode 201a and the drain electrode 202b and connecting the second pattern 212b formed on both the sides in the pixel region. In such a case, so as to be formed apart from the gate electrode 201a and the drain electrode 202b, the third pattern 212c has a first horizontal portion extended horizontally from a connecting portion of the first pattern 212a and the left second pattern 212b (refer to FIG. 6), a first stepped portion extended toward the drain electrode 202b, a second horizontal portion extended horizontally above the drain electrode 202b, a second stepped portion extended downward without overlap with the drain electrode 202b, and a third horizontal portion extended horizontally to the right second pattern 212b. The third pattern 212c having a stair-shape as described above has a high risk of occurrence of line cut at the stepped portions. Further, because the third pattern 212c is formed apart from the drain electrode 202b, the third pattern 212c has a relatively small line width, which causes increase in a resistance value of the common line. As a result, a common voltage value applied to left and right sides of the substrate 300 is decreased at the center portion, and thus there is a risk of occurrence of shutdown crosstalk. Specifically, because the third pattern 212c is formed apart from the thin film transistor region, the occupied space by the third pattern 212c creates loss of an aperture ratio. Moreover, the line width of each of the first to third patterns 212a to 212c is set to be generally less than 10 μm, and thus a resistance value of the common line 212 is increased.

A non-described reference numeral 201 denotes a gate line, 202a denotes a source electrode, 203 denotes a pixel electrode, 205 denotes a gate insulating film, 206 denotes a protective film, and 206a denotes a protective film hole. The shapes of the above elements except for the shape of the common line 211 are substantially identical to the shapes shown in FIGS. 4 and 5.

Figure 8:
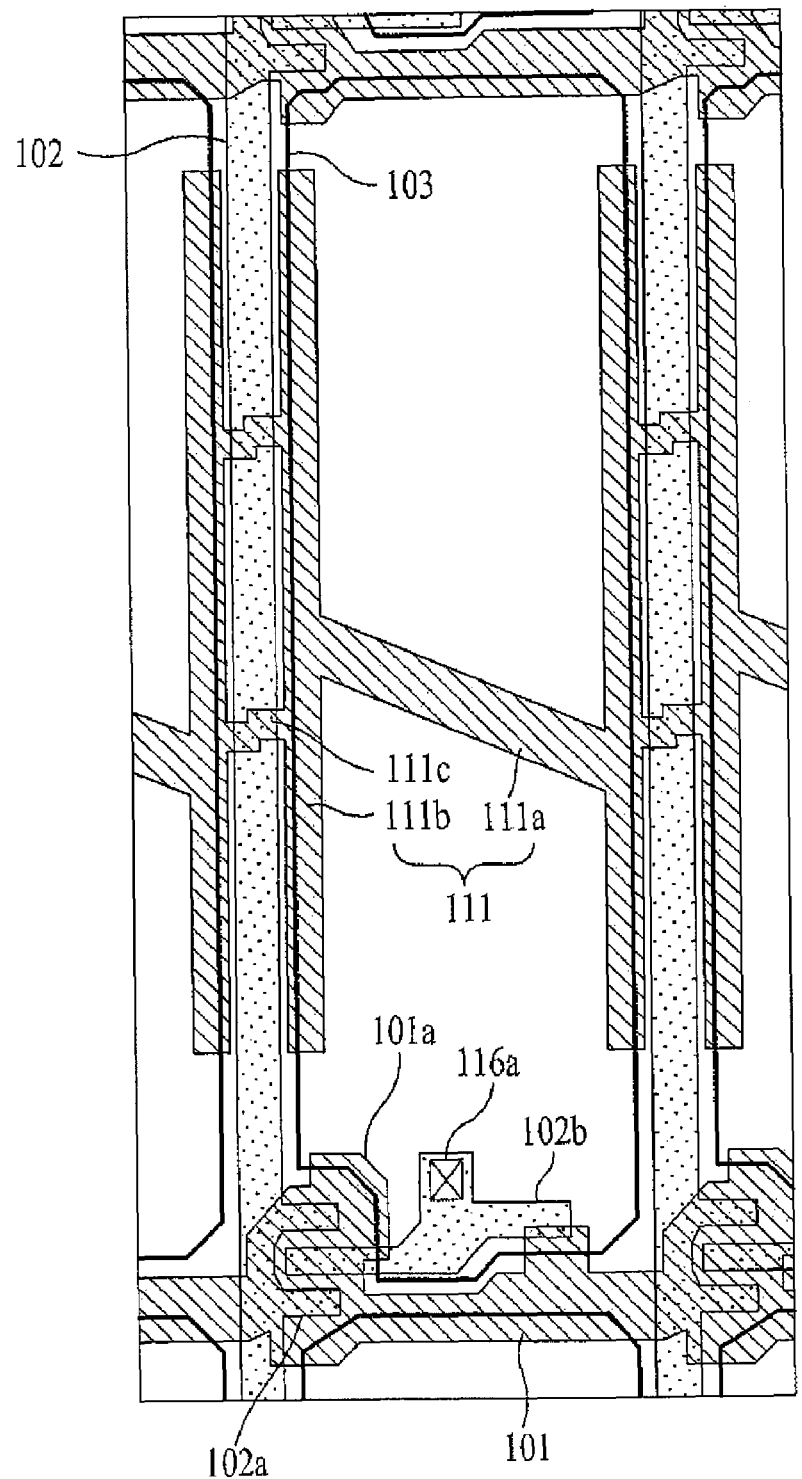
FIG. 8 is a plan view illustrating one pixel of a thin film transistor array substrate having an "H"-shaped Vcom structure.

FIG. 8 is a plan view illustrating one pixel of a thin film transistor array substrate having an "H"-shaped Vcom structure.

As shown in FIG. 8, a thin film transistor array substrate including a common line having an "H"-shaped structure includes a plurality of gate lines 101 and a plurality of data lines 102 intersecting each other to define pixel regions, thin film transistors (TFTs) formed at the intersections of the gate lines 101 and the data lines 102, and pixel electrodes 103 formed in the pixel regions.

In the above-constituted substrate, a common line 111 includes a first pattern 111a formed in a direction of crossing the pixel electrode 103, a second pattern 111b formed on both sides in the pixel region, and a third pattern 111c formed across the data lines 102 between the second patterns 111b of the adjacent pixel regions. However, because the first pattern 111a of light shielding metal having a large width is formed across the pixel region, loss of an aperture ratio is generated due to an occupied area by the first pattern 111a and a boundary portion thereof.

In contrast with the common line structure spaced apart from the drain electrode and the "H"-shaped common line structure as described above, the "U"-shaped common line structure according to the present invention has the following advantages and effects.

First, in order to minimize the occupied area by the light shielding metal in the pixel region, the "U"-shaped common line is formed adjacent to the boundary portion of the pixel region, such as the gate line and the data line. Accordingly, loss of an aperture ratio can be prevented. For example, it was known from test results that the aperture ratio of the "U"-shaped common line structure shown in FIG. 3 is about 57.24%, which is increased from the aperture ratio of about 54.3% of the "H"-shaped common line structure shown in FIG. 8.

Second, when the "U"-shaped common line is formed, in order to secure a contact portion with the pixel electrode, the "U"-shaped common line is formed to be extended to a region below the drain electrode having a large width of about 10 μm or more. Therefore, the line width of the common line is increased, and thus a resistance of the common line can be decreased. This can be readily understood from FIGS. 4 and 7. The present invention is constituted such that the drain electrode 302b and the third pattern 311c of the common line 311 are overlapped with each other by an "a" width (refer to FIG. 4). In other words, since the line width of the common line is increased by overlapping the drain electrode that is originally a light shield element, an aperture ratio is not decreased. Further, the effect of increase in a storage capacitance between the pixel electrode 303 contacted with the drain electrode 302b and the common line 311 can be obtained. It was known from test results that a resistance of the common line is decreased to 7.18 kΩ by the increase in the line width, from a resistance of 10.73 kΩ of the structure shown in FIG. 6 and a resistance of 8.1 kΩ of the structure shown in FIG. 8. Such a decrease in the resistance of the common line prevents a problem such that a common voltage applied to the common line at left and right sides of a panel drops at a center portion. As a result, shutdown crosstalk, which is a phenomenon of that left and right sides of a panel are reddish or are observed as dim blocks when closing Windows, can be prevented.

Third, when the common line is formed in a "U"-shape, the third pattern has a shape having a slanted portion from the region above the gate electrode to the drain electrode-formed position to connect the boundary portion of the second pattern disposed on both the sides in the pixel region (but not having the stepped portions (refer to FIG. 6)). Accordingly, the common line is prevented from having stepped portions for the purpose of being spaced apart from the drain electrode on the plane, and as a result loss of an aperture ratio and line cut due to the stepped portions can be prevented.

That is, when the common line is formed in a "U"-shape, the third pattern has a shape having a slanted portion from the region above the gate electrode to the drain electrode-formed position to connect the "I"-shaped boundary portion disposed on both the sides in the pixel region (but not having the stepped portions). As a result, occurrence of gate dim can be prevented, and productivity is improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor array substrate comprising:
   a plurality of gate lines and a plurality of data lines on a substrate, to define pixel regions crossing each other;
   thin film transistors, each formed at the intersection of the gate lines and the data lines, and including a gate electrode, a source electrode and a drain electrode;
   common lines, each including a first pattern formed across the data lines, a second pattern formed adjacent to the data lines on both sides in the pixel region and parallel to the data lines, and a third pattern formed adjacent to the gate lines to connect the second pattern disposed on both the sides in the associated one of the pixel regions, and passing below the drain electrode of the thin film transistors, wherein the first pattern, the second pattern and the third pattern are integrated; and
   a pixel electrode formed in each pixel region,
   wherein a contact portion is formed between the drain electrode and the pixel electrodes to connect each other,
   wherein the third pattern is fully overlapped with the contact portion, and
   wherein the second pattern formed on the both sides in the pixel region and the third pattern are connected to each other, and have a "U"-shape with respect to an edge of the pixel electrode in each pixel region.

2. The thin film transistor array substrate according to claim 1, wherein the third pattern positioned below the drain electrode has a line width larger than the second pattern.

3. The thin film transistor array substrate according to claim 1, wherein the third pattern has a slanted portion which is slanted from a region horizontally above the gate electrode to the drain electrode while being spaced apart from the gate electrode, and a protruding portion which is protruded from the slanted portion so as to be overlapped with the drain electrode.

4. The thin film transistor array substrate according to claim 3, wherein the protruding portion of the third pattern has a line width of 10 to 28 μm.

5. The thin film transistor array substrate according to claim 1, wherein the second pattern has a line width of 4 to 8 μm.

6. The thin film transistor array substrate according to claim 1, wherein the first pattern is provided more than one in number between the respective pixel regions.

7. The thin film transistor array substrate according to claim 1, wherein the gate lines and the common lines are formed on the substrate.

8. The thin film transistor array substrate according to claim 1, wherein the pixel electrodes are partially overlapped with the second pattern, and are fully overlapped with the third pattern.

* * * * *